(12) United States Patent
Gong

(10) Patent No.: US 10,163,414 B2
(45) Date of Patent: Dec. 25, 2018

(54) GOA DRIVING CIRCUIT

(71) Applicant: WUHAN CHINA STAR OPTOELECTRONICS TECHNOLOGY CO., LTD., Hubei (CN)

(72) Inventor: Qiang Gong, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 90 days.

(21) Appl. No.: 15/313,926

(22) PCT Filed: Jun. 14, 2016

(86) PCT No.: PCT/CN2016/085646
§ 371 (c)(1),
(2) Date: Nov. 23, 2016

(87) PCT Pub. No.: WO2017/197686
PCT Pub. Date: Nov. 23, 2017

(65) Prior Publication Data
US 2018/0158425 A1 Jun. 7, 2018

(30) Foreign Application Priority Data
May 20, 2016 (CN) .......................... 2016 1 0341419

(51) Int. Cl.
*G09G 3/36* (2006.01)
*G09G 3/3266* (2016.01)
(52) U.S. Cl.
CPC ......... *G09G 3/3674* (2013.01); *G09G 3/3266* (2013.01); *G09G 3/36* (2013.01); *G09G 2310/08* (2013.01)

(58) Field of Classification Search
CPC . G09G 3/3674; G09G 3/3266; G09G 2310/08
See application file for complete search history.

(56) References Cited

U.S. PATENT DOCUMENTS 9,343,027 B2   5/2016  Zhu et al.
2016/0365050 A1* 12/2016 Qing .................... G09G 3/3677

FOREIGN PATENT DOCUMENTS

| CN | 104361853 A | 2/2015 |
| CN | 104361875 A | 2/2015 |
| CN | 104992662 A | 10/2015 |
| CN | 105355179 A | 2/2016 |

OTHER PUBLICATIONS

English abstract translation of CN 105355179.
English abstract translation of CN 104992662.
English abstract translation of CN 104361853.
English abstract translation of CN 104361875.

* cited by examiner

*Primary Examiner* — Charles Hicks
(74) *Attorney, Agent, or Firm* — WPAT, PC

(57) ABSTRACT

A GOA driving circuit is provided, which includes a first signal generating module for generating the forward scan control signal based upon a first clock signal and a cascade signal; a control module for controlling an output of the cascade signal based upon the forward scan control signal and the reverse scan control signal; a latch module for latching the cascade signal by the first clock signal and the second clock signal; a processing module and a buffer module.

12 Claims, 8 Drawing Sheets

GOA DRIVING CIRCUIT

FIELD OF THE INVENTION

The present invention relates to the field of driving techniques, and particularly to a GOA driving circuit.

BACKGROUND OF THE INVENTION

In a technical solution of a conventional GOA (Gate driver On Array), typically, a scanning driving circuit is formed on an array substrate in the manufacturing process of a conventional thin film transistor array substrate, in order to achieve progressively scanning the pixel array on the thin film transistor array substrate.

However, the signal sources of the conventional GOA circuit are directly generated from a driver chip (integrated chip, IC). In total, seven signal sources are required, which respectively are an RST (reset signal), an STV (first cascade input signal on the circuit), a U2D (forward scanning control signal), a D2U (reverse scanning control signal), a CK1 (first clock signal), a CK2 (second clock signal), and a GAS (All Gate On, function control signal). It can be seen that the conventional GOA circuit has many input terminals and a great number of WOA (wire on array) wires (the connecting wires between the driver chip and the GOA circuit), thereby increasing the production cost of the chip.

Therefore, it is necessary to propose a new technical solution to solve the above technical problems.

SUMMARY OF THE INVENTION

A primary object of the present invention is to provide a driving circuit for resolving the technical problem of the great number of the signal sources required in a conventional GOA circuit, causing the great number of terminals in the driver chip, and a high production cost of the chips To resolve the above problem, the present invention provides a GOA driving circuit, comprising: at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:

a first signal generating module for generating the forward scan control signal based upon the first clock signal and the cascade signal;

a second signal generating module for generating the reverse scan control signal based upon the second clock signal and the cascade signal;

a control module for controlling an output of the cascade signal based upon the forward scan control signal and the reverse scan control signal;

a latch module for latching the cascade signal and generating a latch signal by the first clock signal and the second clock signal;

a third signal generating module for generating the function control signal based upon the second clock signal, the first clock signal, and the reset signal;

a processing module for conducting an NAND logic process on the latch signal to obtain a processing signal by the second clock signal or the first clock signal, and controlling an output of the processing signal based upon the function control signal; and a buffer module for reversing an output signal from the processing module to obtain a scan signal for increasing a driving capability of the scan signal.

A GOA driving circuit, comprising: at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:

a first signal generating module for generating the reverse scan control signal based upon the second clock signal and the cascade signal;

a control module for controlling an output of the cascade signal based upon the forward scan control signal and the reverse scan control signal;

a latch module for latching the cascade signal and generating a latch signal by the first clock signal and the second clock signal;

a processing module for conducting an NAND logic process on the latch signal to obtain a processing signal by the second clock signal or the first clock signal, and controlling an output of the processing signal based upon the function control signal; and a buffer module for reversing an output signal from the processing module to obtain a scan signal for increasing a driving capability of the scan signal.

To resolve the above problem, the present invention provides a GOA driving circuit, comprising: at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:

a second signal generating module for generating the reverse scan control signal based upon the second clock signal and the cascade signal;

a control module for controlling an output of the cascade signal based upon the forward scan control signal and the reverse scan control signal;

a latch module for latching the cascade signal and generating a latch signal by the first clock signal and the second clock signal;

a processing module for conducting an NAND logic process on the latch signal to obtain a processing signal by the second clock signal or the first clock signal, and controlling an output of the processing signal based upon the function control signal; and a buffer module for reversing an output signal from the processing module to obtain a scan signal for increasing a driving capability of the scan signal.

To resolve the above problem, the present invention provides a GOA driving circuit, comprising: at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:

a second signal generating module for generating the reverse scan control signal based upon the second clock signal and the cascade signal;

a control module for controlling an output of the cascade signal based upon the forward scan control signal and the reverse scan control signal;

a latch module for latching the cascade signal and generating a latch signal by the first clock signal and the second clock signal;

a processing module for conducting an NAND logic process on the latch signal to obtain a processing signal by the second clock signal or the first clock signal, and controlling an output of the processing signal based upon the function control signal; and a buffer module for reversing an output signal from the processing module to obtain a scan signal for increasing a driving capability of the scan signal.

To resolve the above problem, the present invention provides a GOA driving circuit, comprising: at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:

a control module for controlling an output of the cascade signal based upon the forward scan control signal and the reverse scan control signal;

a latch module for latching the cascade signal and generating a latch signal by the first clock signal and the second clock signal;

a third signal generating module for generating the function control signal based upon the second clock signal, the first clock signal, and the reset signal;

a processing module for conducting an NAND logic process on the latch signal to obtain a processing signal by the second clock signal or the first clock signal, and controlling an output of the processing signal based upon the function control signal; and a buffer module for reversing an output signal from the processing module to obtain a scan signal for increasing a driving capability of the scan signal.

Since some of the signal sources of the GOA driving circuit are used to generate the other signal sources, the GOA driving circuit of the present invention reduces the number of output terminals of the driver chip, simplifies the driver chip, and decreases the high production cost of the driver chip.

DETAILED DESCRIPTION OF THE PREFERRED EMBODIMENTS

Figure 1:
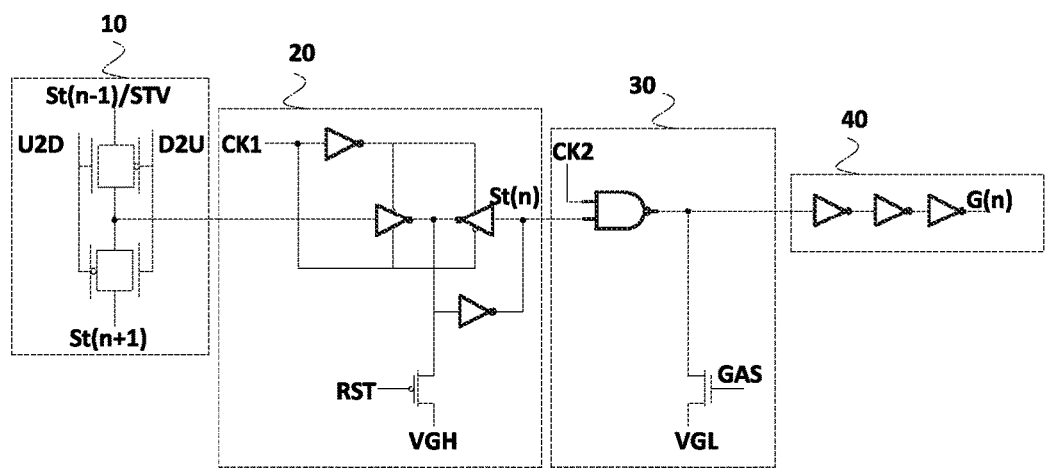
FIG. 1 is a circuit diagram of a GOA driving circuit in a prior art.

The following description of the embodiments with reference to the accompanying drawings is used to illustrate particular embodiments of the present invention. The directional terms referred in the present invention, such as "upper", "lower", "front", "back", "left", "right", "inner", "outer", "side surface", etc. are only directions with regard to the accompanying drawings. Therefore, the directional terms used for describing and illustrating the present invention are not intended to limit the present invention. In the drawings, units with similar structures are indicated by the same reference number.

The GOA driving circuit of the present invention is applicable to display panels, such as TFT-LCDs (thin film transistor liquid crystal displays, thin film transistor liquid crystal display panels), OLEDs (organic light emitting diode, organic light emitting diode display panels), etc. The GOA driving circuit of the present invention is used for providing a driving signal (scan signal) to the display panel.

Refer to FIG. 1, which is a circuit diagram of a GOA driving circuit in a prior art.

The GOA driving circuit of the present invention includes at least two driving units cascaded to each other, wherein an N-th stage driving unit is inputted with a cascade signal st(n−1) or st(n+1) or STV, a forward scan control signal U2D, a reverse scan control signal D2U, a first clock signal CK1, a second clock signal CK2, a reset signal RST, and a function control signal GAS. During a forward scan the cascade signal is st(n−1), and when scanning the first line, the cascade signal is STV. During a reverse scan the cascade signal is st(n+1), and when scanning the last line, the cascade signal is STV.

The N-th stage driving unit includes a control module 10, a latch module 20, a processing module 30 and a buffer module 40.

The control module 10 is used for controlling an output of the cascade signal based upon the forward scan control signal U2D and the reverse scan control signal D2U.

The latch module 20 is used for latching the cascade signal and generating a latch signal (n) by the first clock signal CK1 and the second clock signal CK2. When N is an odd number, the latch module 20 latches the cascade signal by the first clock signal CK1; when N is an even number, the latch module 20 latches the cascade signal by the second clock signal CK2.

The processing module 30 is used for conducting an NAND logic process on the latch signal to obtain a processing signal by the second clock signal CK2 or the first clock signal CK1, and controlling an output of the processing signal based upon the function control signal GSA. When N is an odd number, the processing module 30 conducts an NAND logic process on the latch signal by the second clock signal CK2; when N is an even number, the processing module 30 conducts an NAND logic process on the latch signal by the first clock signal CK1.

The buffer module 40 is used for reversing an output signal from the processing module 30 to obtain a scan signal G(n) for increasing a driving capability of the scan signal.

Thus, the GOA circuit in the prior art has many input signal sources, totally including RST, STV, U2D, D2U, CK1, CK2, and GAS terminals. It can be seen that the driver chip has many terminals, causing high production costs.

The RST signal is used for resetting the entire circuit before the driving circuit operation. Before the driving circuit operation, the RST signal is at low voltage; during the driving circuit operation, the RST signal is at high voltage.

Figure 2:
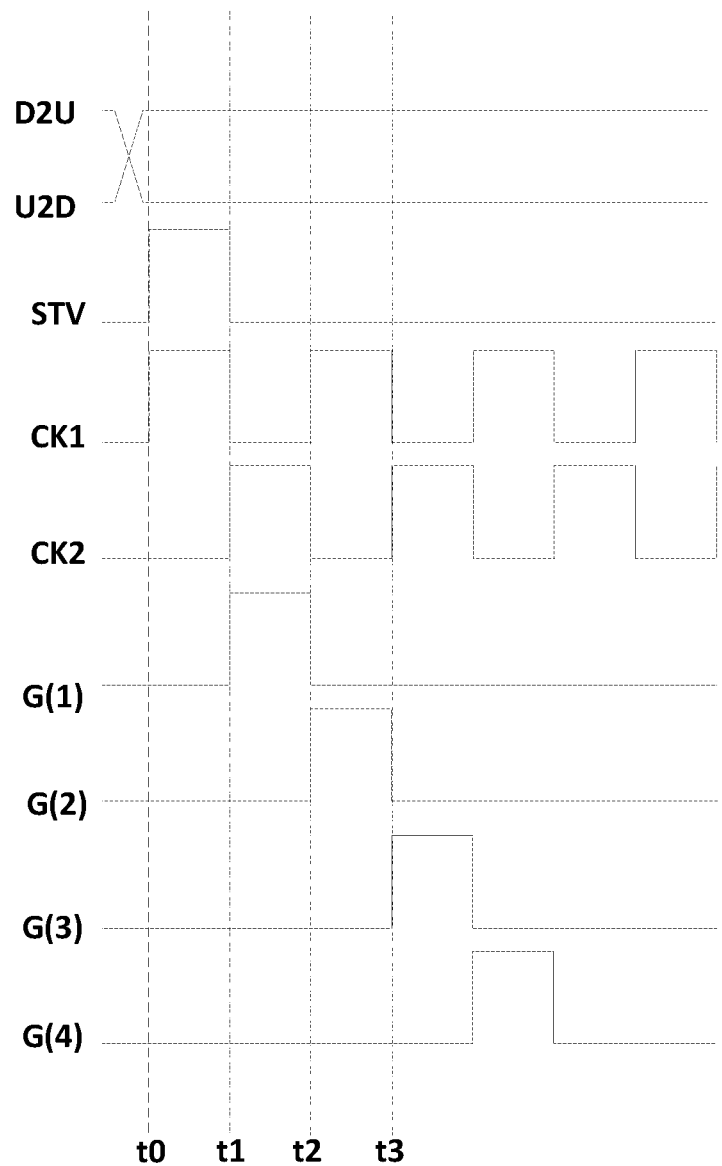
FIG. 2 is a waveform diagram of each signal during a forward scan of a GOA driving circuit in a prior art.
Figure 3:
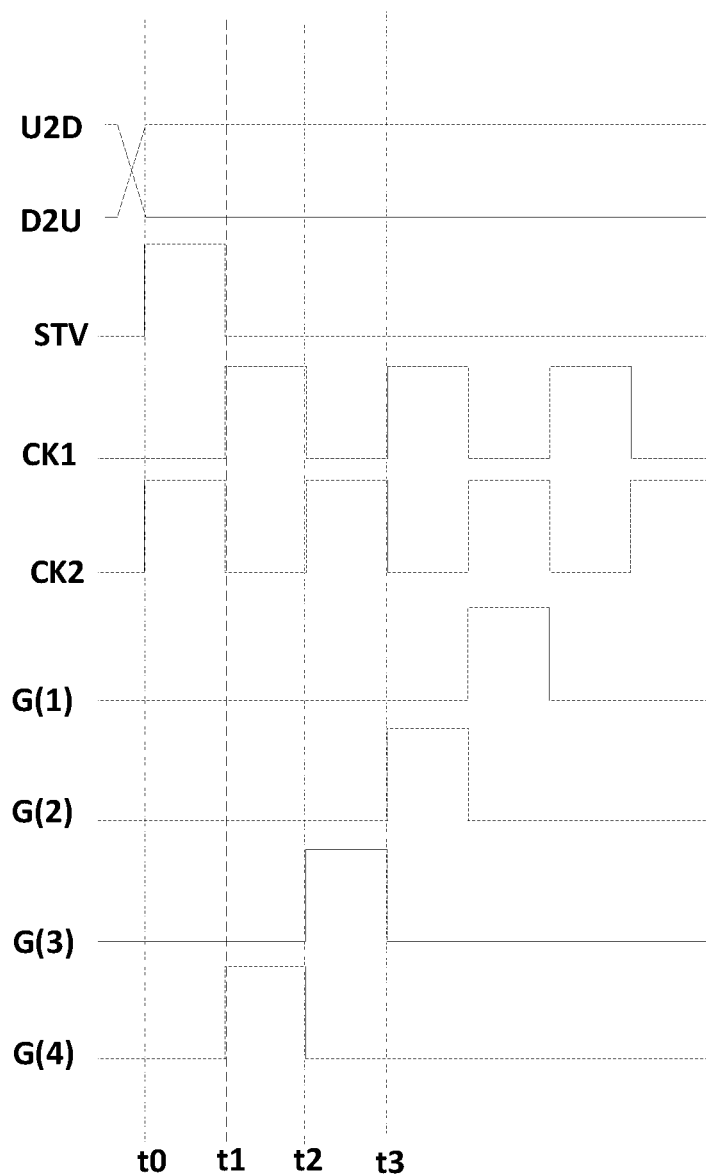
FIG. 3 is a waveform diagram of each signal during a reverse scan of a GOA circuit in a prior.
Figure 4:
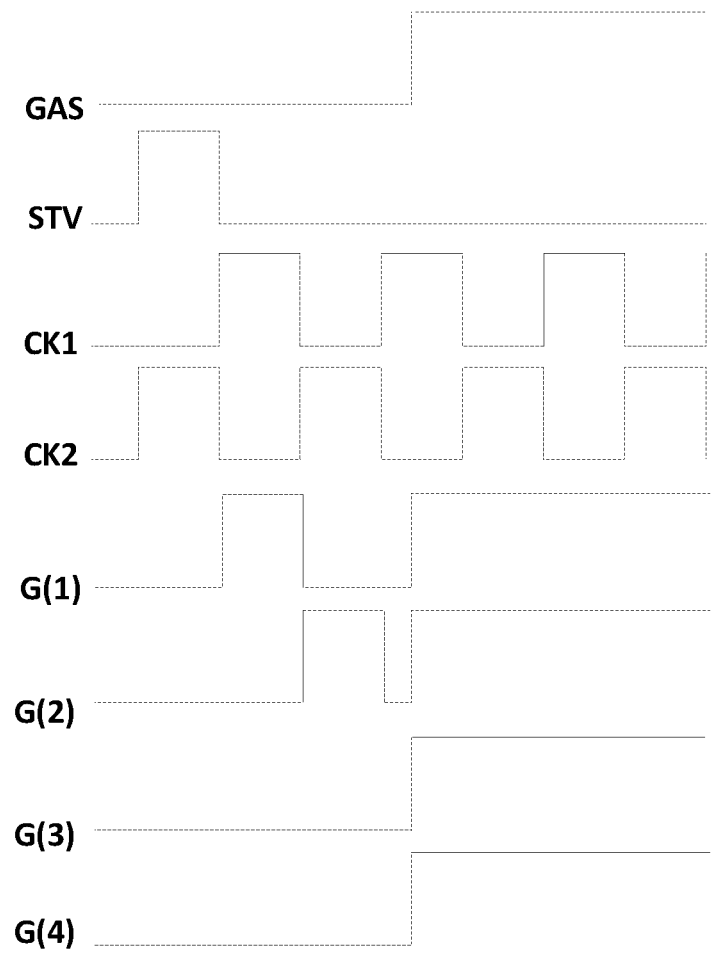
FIG. 4 is a waveform diagram of each signal of a GOA circuit in a prior art when a function control signal is at high voltage.

When the number of the scan lines is 4, as an example, G(1)-G(4) respectively represent the first to the fourth scan signal line. As shown in FIG. 2 to FIG. 4, when the GAS signal is at low voltage, the control module 10 can only output the cascade signal when the forward scan control signal is at high voltage or the reverse scan control signal is at low voltage, wherein in the GOA driving circuit on the first stage, the latch module 20 is inputted with CK1, and the processing module 20 is inputted with CK2; in the GOA driving circuit on the second stage, the latch module 20 is inputted with CK2, and the processing module 20 is inputted with CK1; in the GOA driving circuit on the third stage, the latch module 20 is inputted with CK1, and the processing module 20 is inputted with CK2; in the GOA driving circuit on the fourth stage, the latch module 20 is inputted with CK2, and the processing module 20 is inputted with CK1.

As shown in FIG. 2, during the forward scan, the GAS is at low voltage, the U2D is at high voltage, the D2U is at low voltage, and the control module 10 outputs the n−1 stage cascade signal st(n−1). Herein, when n is 1, as an example, the control module 10 outputs the cascade signal STV, and outputs the latch signal st(1) after the action of the latch module 20. Only when the CK1 and the STV are both at high voltage, st(1) outputs high voltage, so during the t0-t1 period, st(1) outputs high voltage. At the time point t1, when the CK1 is at low voltage, the latch module 20 continues to maintain st(1) at high voltage. Since at the time point t2, the CK1 turns into high voltage again, but the STV is at low voltage at this time, therefore, st(1) turns into low voltage at t2, and after the NAND process of the processing module 30, the CK2 and st(1) also undergo the NAND logic process. The processing module 30 only outputs low voltage during the t1-t2 period, and after the reverse process of the buffer module 40, the output signal G(1) is at high voltage during the t1-t2 period.

Herein, when n is 2, as an example, the control module 10 outputs the cascade signal st(1), and outputs the latch signal st(2) after the action of the latch module 20, since during the t0-t2 period, st(1) is at high voltage, and the CK2 is at high voltage during the t1-t2 period. Only when the CK1 and the STV are both at high voltage, st(2) outputs high voltage, so during the t1-t2 period, st(2) outputs high voltage. At the time point t2, when the CK2 is at low voltage, the latch module 20 continues to maintain st(2) at high voltage. Since at the time point t3, the CK2 turns into high voltage again, but the st(1) is at low voltage at this time, therefore, st(2) turns into low voltage at t3, and after the NAND process of the processing module 30, the CK1 and st(2) also undergo the NAND logic process. The processing module 30 only outputs low voltage during the t2-t3 period, and after the reverse process of the buffer module 40, the output signal G(2) is at high voltage during the t2-t3 period.

The driving principle of stage 3 and stage 4 of the GOA driving circuit is similar to the driving principle of stage 1 and stage 2.

As shown in FIG. 3, during the reverse scan, the U2D is at low voltage and the D2U is at high voltage. Herein, when n is 4, as an example, the control module 10 outputs the cascade signal STV, and outputs the latch signal st(4) after the action of the latch module 20. Only when the CK2 and the STV are both at high voltage, st(4) outputs high voltage, so during the t0-t1 period, st(4) outputs high voltage. At the time point t1, when the CK2 is at low voltage, the latch module 20 continues to maintain st(4) at high voltage. Since at the time point t2, the CK2 turns into high voltage again, but the STV is at low voltage at this time, therefore, st(4) turns into low voltage at t2, and after the NAND process of the processing module 30, the CK1 and st(4) also undergo the NAND logic process. The processing module 30 only outputs low voltage during the t1-t2 period, and after the reverse process of the buffer module 40, the output signal G(4) is at high voltage during the t1-t2 period.

Herein, when n is 3, as an example, the control module 10 outputs the cascade signal st(4), and outputs the latch signal st(3) after the action of the latch module 20, since during the t0-t2 period, st(4) is at high voltage, and the CK1 is at high voltage during the t1-t2 period. Only when the CK1 and the STV are both at high voltage, st(3) outputs high voltage, so during the t1-t2 period, st(3) outputs high voltage. At the time point t2, when the CK1 is at low voltage, the latch module 20 continues to maintain st(3) at high voltage. Since at the time point t3, the CK1 turns into high voltage again, but the st(3) is at low voltage at this time, therefore, st(3) turns into low voltage at t3, and after the NAND process of the processing module 30, the CK1 and st(2) also undergo the NAND logic process. The processing module 30 only outputs low voltage during the t2-t3 period, and after the reverse process of the buffer module 40, the output signal G(3) is at high voltage during the t2-t3 period.

The driving principle of stage 1 and stage 2 of the GOA driving circuit is similar to the driving principle of stage 3 and stage 4.

As shown FIG. 4, when the GAS is at high voltage, regardless of the cascade signal being high and low, the inputs of the buffer module 40 are low voltage power source VGL, and after the reverse action of the buffer module, the outputted scan signal G (n) of each line is in high.

Figure 5:
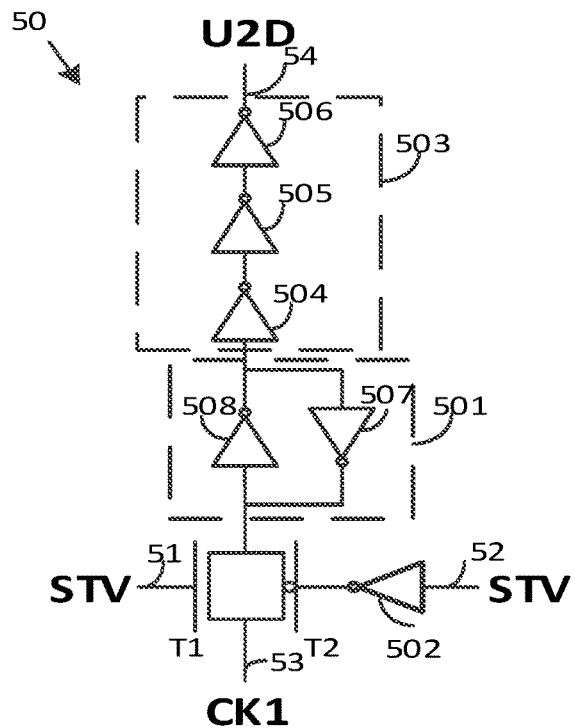
FIG. 5 is a circuit diagram in a first signal generating module of a GOA driving circuit of the present invention.

Refer to FIG. 5, which is a circuit diagram in a first signal generating module of a GOA driving circuit of the present invention The difference between this embodiment and the GOA driving circuit in the prior art is that the forward scan control signal U2D is generated by the first signal generating module, or the reverse scan control signal D2U is generated by the second signal generating module, or the function control signal GAS is generated by the third signal generating module, and namely the GOA driving circuit of the present embodiment at least includes one of the first signal generating module, the second signal generating module and the third signal generating module. The first signal generating module 50 is used for generating the forward scan control signal based upon the first clock signal and the cascade signal.

As shown in FIG. 5, the first signal generating module 50 includes a first clock signal input terminal 53, a first switch signal input terminal 51, a second switch signal input terminal 52, and a first converting output terminal 54, wherein the first converting output terminal 54 is used for outputting the forward scan control signal U2D, the first clock input terminal 53 is used for inputting the first clock signal CK1, and the first switch signal input terminal 51 and the second switch signal input terminal 52 are both used for inputting the cascade signal STV;

The first signal generating module 50 further includes:

A first thin film transistor T1 including a first gate, a first source and a first drain; wherein the first gate is connected with the first switch signal input terminal 51, the first source is connected with the first clock signal input terminal 53, and the first drain connected with an input terminal of a first latch 501. The first thin film transistor T1 is an NPN type thin film transistor;

A first inverter 502, an input terminal of which is connected with the second switch signal input terminal 52;

A second thin film transistor T2 including a second gate, a second source, and a second drain. The second gate is connected with an output terminal of the first inverter 502, the second source is connected with the first clock signal input terminal 53, and the second drain connected with the input terminal of the first latch 501. The second thin film transistor T2 is a PNP type thin film transistor;

The first latch 501, the output terminal of which is connected with an input terminal of a first inverter group 503. The first latch 501 includes two inverters 507 and 508, wherein the output terminal of the inverter 507 is connected with the input terminal of the inverter 508, and the input terminal of the inverter 507 is connected with the output terminal of the inverter 508;

The first inverter group 503 including a second inverter 504, a third inverter 505 and a fourth inverter 506, which are connected in sequence, wherein an output terminal of the first inverter group 503 is connected with the first converting output terminal 54.

Figure 6:
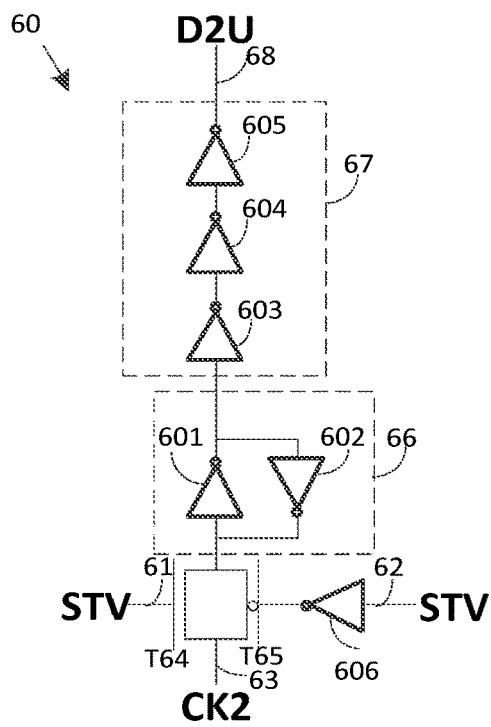
FIG. 6 is a circuit diagram in a second signal generating module of a GOA driving circuit of the present invention.

As shown in FIG. 6, the second signal generating module 60 is used for generating the reverse scan control signal based upon the second clock signal and the cascade signal.

The second signal generating module 60 includes a second clock signal input terminal 63, a third switch signal input terminal 61, a fourth switch signal input terminal 62, and a second converting output terminal 68, wherein the second converting output terminal 68 is used for outputting the reverse scan control signal D2U, the second clock input terminal 63 is used for inputting the second clock signal CK2, and the third switch signal input terminal 61 and the fourth switch signal input terminal 62 are both used for inputting the cascade signal STV.

The second signal generating module 60 further includes:

A seventh thin film transistor T64 including a seventh gate, a seventh source, and a seventh drain, wherein the seventh gate is connected with the third switch signal input terminal 61, the seventh source is connected with the second clock signal input terminal 63, and the seventh drain is connected with an input terminal of a second latch 66;

A fifth inverter 606, an input terminal of which is connected with the fourth switch signal input terminal 62;

An eighth thin film transistor T65 including an eighth gate, an eighth source and an eighth drain, wherein the eighth gate is connected with an output terminal of the fifth inverter 606, the eighth source is connected with the second clock signal input terminal 63, and the eighth drain is connected with the input terminal of the second latch 66;

The second latch 66, the input terminal of which is connected with an input terminal of a second inverter group 67;

The second inverter group 67 including a fifth inverter 603, a sixth inverter 604, and a seventh inverter 605, which are connected in sequence, wherein an output terminal of the second inverter group 67 is connected with the second converting output terminal 68.

Figure 7:
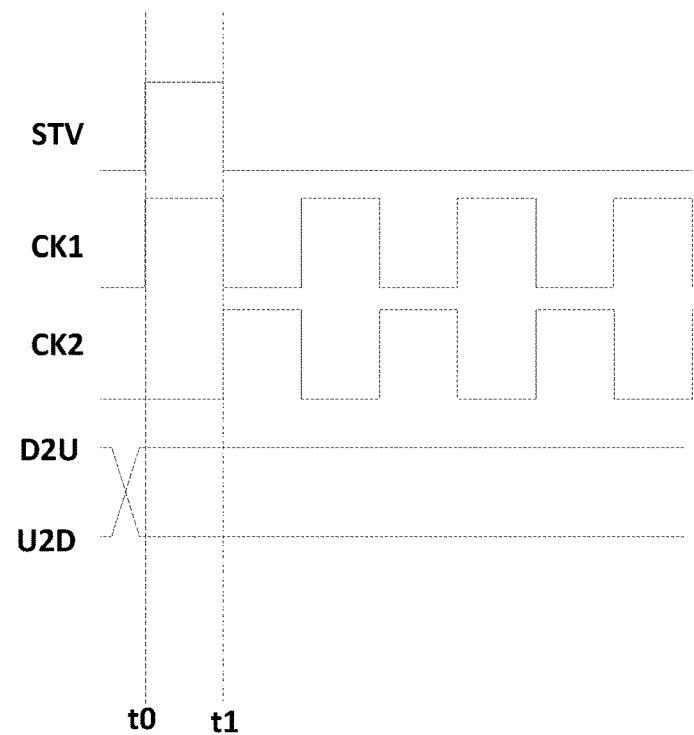
FIG. 7 is a waveform diagram during a forward scan of a first signal generating module and a second signal generating module.

Refer to FIG. 5 in combination with and FIG. 7, during the forward scan, since during the t0-t1 period the STV is at high voltage and the CK1 is at high voltage, the first thin film transistor T1 and the second thin film transistor T2 output high voltage. After the first latch, low voltage is outputted, and after the time point t1, the first latch continues to output low voltage due to the latching action of the first latch 501. After the reverse action of the first inverter group, and after the time point t0, the first converting output terminal still outputs high voltage, and namely the U2D outputs high voltage.

Refer to FIG. 6 in combination with and FIG. 7, during the forward scan, since during the t0-t1 period the STV is at high voltage and the CK2 is at low voltage, the seventh thin film transistor T64 and the eighth thin film transistor T65 output high voltage. After the first latch, low voltage is outputted, and after the time point t1, the second latch continues to output high voltage due to the latching action of the second latch. After the reverse action of the second inverter group, and after the time point t0, the D2U outputs low voltage.

Figure 8:
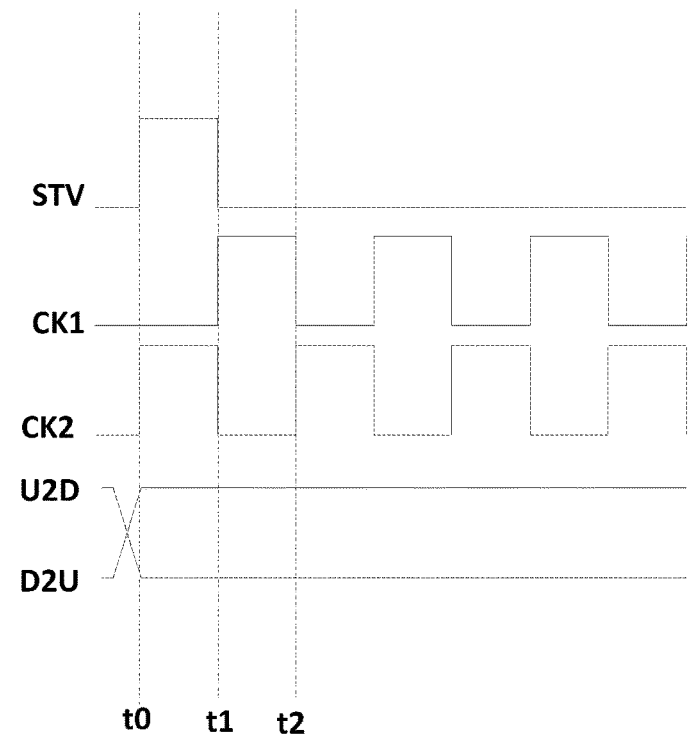
FIG. 8 is a waveform diagram during a reverse scan of a first signal generating module and a second signal generating module.

Refer to FIG. 5 in combination with and FIG. 8, during the reverse scan, since during the t0-t1 period the STV is at high voltage and the CK1 is at low voltage, the first thin film transistor T1 and the second thin film transistor T2 output low voltage. During the t0-t1 period, U2D outputs low voltage. After the time point t1, due to the latching action of the first latch 501, the first converting output terminal still outputs low voltage, and namely the U2D outputs low voltage.

Refer to FIG. 6 in combination with and FIG. 8, during the reverse scan, since during the t0-t1 period the STV is at high voltage and the CK2 is at high voltage, the seventh thin film transistor T64 and the eighth thin film transistor T65 output high voltage. During the t0-t1 period, D2U outputs high voltage. After the time point t1, due to the latching action of the second latch 66, the second converting output terminal still outputs high voltage, and namely the D2U outputs high voltage.

Figure 9:
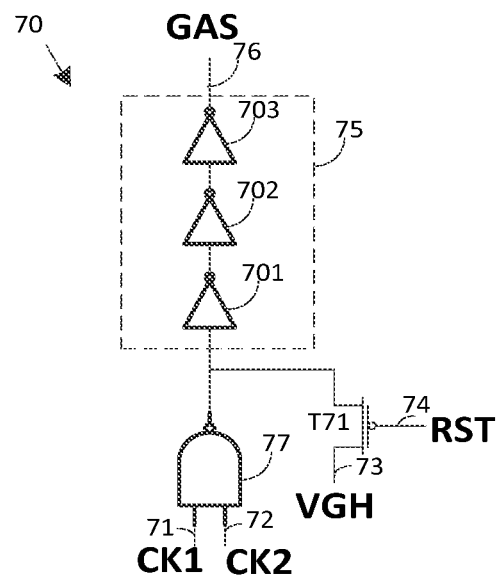
FIG. 9 is a circuit diagram in a third signal generating module of a GOA driving circuit of the present invention

As shown in FIG. 9, a third signal generating module 70 is used for generating the function control signal GAS based upon the second clock signal CK2, the first clock signal CK1 and the reset signal RST.

The N-th stage driving unit is also inputted with a high voltage power source VGH. The third signal generating module 70 includes a third clock signal input terminal 71, a fourth clock signal input terminal 72, a first signal source input terminal 73, a fifth switch signal input terminal 74, and a third converting output terminal 76, wherein the third clock signal input terminal 71 is used for inputting the first clock signal CK1, the fourth clock signal input terminal 72 is used for inputting the second clock signal CK2, the first signal source input terminal 73 is used for inputting the high voltage power source VHG, the fifth switch signal input terminal 74 is used for inputting the reset signal RST, and the third switch output terminal 76 is used for outputting the function control signal GAS.

The third signal generating module 70 further includes:

A first NAND gate 77 including a first logic input terminal, a second logic input terminal and a first logic output terminal, wherein the first logic input terminal is connected with the third clock signal input terminal 71, the second logic input terminal is connected with the fourth clock signal input terminal 72, the first logic output terminal is connected with a ninth drain;

A ninth thin film transistor T71 including a ninth gate, a ninth source, and the ninth drain, wherein the ninth gate is connected with the fifth switch signal input terminal 74, the ninth source is connected with the first signal source input terminal 73, and the ninth drain is connected with an input terminal of a third inverter group 75;

The third inverter group 75 including an eighth inverter 701, a ninth inverter 702, and a tenth inverter 703, which are connected in sequence, wherein an output terminal of the third inverter group is connected with the third switch output terminal 76.

Figure 10:
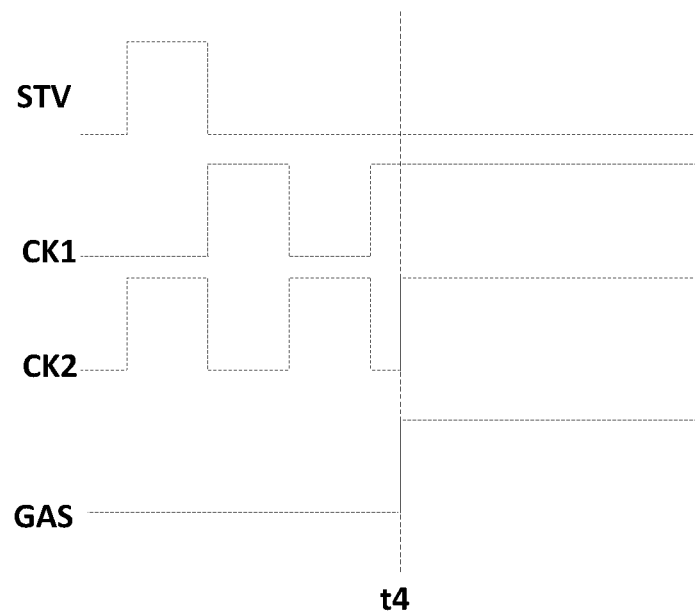
FIG. 10 is a waveform diagram of a third signal generating module.

As shown in FIG. 9 and FIG. 10, before the time point t4, since one of the CK1 and the CK2 is at high voltage and the other is at low voltage, after the NAND logic process, the NAND gate outputs high voltage, and then after the reverse action of the third inverter group, the GAS is at low voltage. After the time point t4, since the CK1 and CK2 are at high voltage, after the NAND logic process, the NAND gate outputs low voltage, i.e. the third inverter group is inputted with low voltage, and then after the reverse process of the third inverter group, the GAS is at high voltage.

Figure 11:
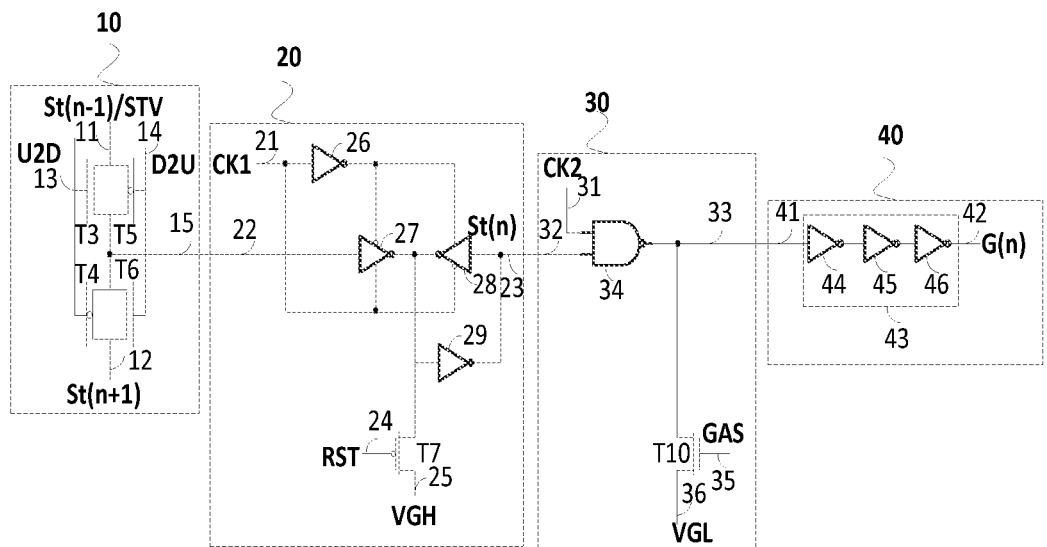
FIG. 11 is a circuit diagram of the remaining modules of a GOA driving circuit of the present invention.

As shown in FIG. 11 in combination with FIG. 5 and FIG. 6, the control module 10 includes a first cascade signal input terminal 11, a second cascade signal input terminal 12, a first switch control signal input terminal 13, a second switch control signal input terminal 14, and a first cascade signal output terminal 15, wherein the first switch control signal input terminal 13 is used for inputting the forward scan control signal U2D, the second switch control signal input terminal 14 is used for inputting the reverse scan control signal D2U, the first cascade signal input terminal 11 is used for inputting a first cascade signal st(n−1)/STV, the second cascade signal input terminal 12 is used for inputting a second cascade signal st(n+1), the first cascade signal output terminal 15 is used for outputting the first cascade signal or the second cascade signal.

Preferably, in order to reduce the number of terminals, the first switch control signal input terminal 13 is connected with the first converting output terminal 54, and the second switch control signal input terminal 14 is connected with the second converting output terminal 68.

The control module 10 includes:

A third thin film transistor T3 including a third gate, a third source and a third drain, wherein the third gate is connected with the first switch control signal input terminal 13, the third source is connected with the first cascade signal input terminal 11, the third drain is connected with the first cascade signal output terminal 15, and the third thin film transistor T3 is used for controlling an output of the first cascade signal st(n−1)/STV based upon the forward scan control signal U2D;

A fourth thin film transistor T4 including a fourth gate, a fourth source, and a fourth drain, wherein the fourth gate is connected with the first switch control signal input terminal 13, the fourth source is connected with the second cascade signal input terminal 12, the fourth drain is connected with the first cascade signal output terminal 15, and the fourth thin film transistor T4 is used for controlling an output of the second cascade signal st(n+1) based upon the forward scan control signal U2D;

A fifth thin film transistor T5 including a fifth gate, a fifth source and a fifth drain, wherein the fifth gate is connected with the second switch control signal input terminal 14, the fifth source is connected with the first cascade signal input terminal 11, the fifth drain is connected with the first cascade signal output terminal 15, the fourth thin film transistor T5 is used for controlling an output of the first cascade signal st(n−1)/STV based upon the reverse scan control signal D2U; and A sixth thin film transistor T6 including a sixth gate, a sixth source and a sixth drain, wherein the sixth gate is connected with the second switch control signal input terminal 14, the sixth source is connected with the second cascade signal input terminal 12, the sixth drain is connected with the first cascade signal output terminal 15, and the sixth thin film transistor T6 is used for controlling an output of the second cascade signal st(n+1) based upon the reverse scan control signal D2U.

The latch module 20 includes a fifth clock signal input terminal 21, a third cascade signal input terminal 22, a latch signal output terminal 23, a reset signal input terminal 24 and a high voltage power source input terminal 25, wherein the fifth clock signal input terminal 21 is used for inputting the first clock signal CK1 or the second clock signal CK2, the reset signal input terminal 24 is used for inputting the reset signal RST, the high voltage power source input terminal 25 is used for inputting the high voltage power source VGH, and the latch signal output terminal is used for outputting the latch signal, and the third cascade signal input terminal 22 is used for inputting the first cascade signal or the second cascade signal;

The latch module further includes:

A fourteenth inverter 26 including a fourteenth inverting input terminal, a fourteenth inverting output terminal, wherein the fourteenth inverting input terminal is connected with the fifth clock signal input terminal 21, to receive the first clock signal CK1 or the second clock signal CK2;

A fifteenth inverter 27 including a fifteenth inverting input terminal and a fifteen inverting output terminal, wherein the fifteenth inverting input terminal is connected with the third cascade signal input terminal 22, and the fifteenth inverter is also connected with the fourteenth inverting output terminal and the fifth clock signal input terminal 21;

A sixteenth inverter 28 including a sixteenth inverting input terminal and a sixteenth inverting output terminal, wherein the sixteenth inverting input terminal is connected to the latch signal output terminal 23, the sixteenth inverting output terminal is connected with the fifteenth inverting output terminal, and the sixteenth inverter is also connected with the fourteenth inverting output terminal and the fifth clock signal input terminal 21;

An eleventh thin film transistor T7 including an eleventh gate, an eleventh source and an eleventh drain, wherein the eleventh gate is connected with the reset signal input terminal 24, the eleventh source is connected with the high voltage power source input terminal 25, and the eleventh drain is connected with the sixteenth inverting output terminal;

A seventeenth inverter 29 including a seventeenth inverting input terminal and a seventeenth inverting output terminal, wherein the seventeenth inverting input terminal is connected with the eleventh drain, the seventeenth inverting output terminal and the latch signal output terminal 23.

The RST signal is used for resetting the entire circuit before the driving circuit operation. Before the driving circuit operation, the RST signal is at low voltage; during the driving circuit operation, the RST signal is at high voltage.

In combination with FIG. 9, the processing module 30 includes a sixth clock signal input terminal 31, a fourth cascade signal input terminal 32, a process output terminal 33, a second signal source input terminal 36 and a sixth switch signal input terminal 35, wherein the second signal source input terminal 36 is used for inputting a low voltage power source VGL, the sixth switch signal input terminal 35 is used for inputting the function control signal GAS, the sixth clock signal input terminal 31 is used for inputting the second clock signal CK2 and the first clock signal CK1, and preferably in order to reduce the number of the terminals of the driver chip, the sixth switch signal input terminal 35 is connected with the third switch output terminal 76.

A second NAND gate 34 includes a third logic input terminal, a fourth logic input terminal, and a second logic output terminal, wherein the third logic input terminal is connected with the sixth clock signal input terminal 31, the fourth logic input terminal is connected with the fourth cascade signal input terminal 32, and the second logic output terminal is connected with the process output terminal 33.

The tenth thin film transistor T10 includes a tenth gate, a tenth source, and a tenth drain, wherein the tenth gate is connected with the sixth switch signal input terminal 35, the tenth source is connected with the second signal source input terminal 36, and the tenth drain is connected with the second logic output terminal 33.

Figure 12:
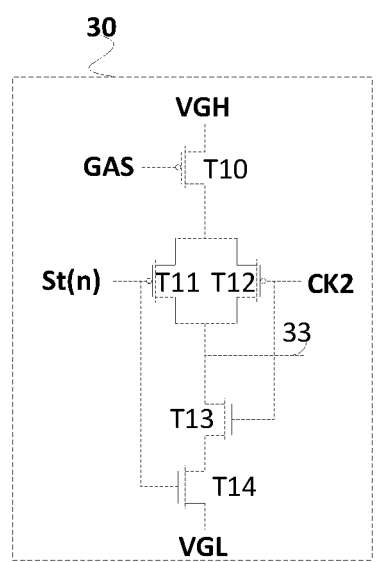
FIG. 12 is a detailed circuit diagram of a processing module of a GOA driving circuit of the present invention.

As shown in FIG. 12, the specific circuit diagram of the processing module 30 specifically includes a tenth thin film transistor T10, a twelfth thin film transistor T11, a thirteenth thin film transistor T12, a fourteenth thin film transistor T13, and a fifteenth thin film transistor T14.

The tenth gate is connected with the drain of the twelfth thin film transistor T11 and the drain of the thirteenth thin film transistor T12, the gate of the thirteenth thin film transistor T12 is connected with the second clock signal CK2, the gate of the twelfth thin film transistor T11 is connected with the input of the fourth cascade signal 32, namely the input terminal of the cascade signal st(n), the source of the twelfth thin film transistor T11 is connected with the source of the thirteenth transistor T12, the source of the twelfth thin film transistor T11 is further connected with the drain of the fourteenth transistor T13, the source of the fourteenth thin film transistor T13 is connected with the drain of the fifteenth thin film transistor T14, the gate of the fourteenth thin film transistor T13 is connected with the gate of the thirteenth thin film transistor T12, the source of the fifteenth thin film transistor T14 is connected with the VGL, the gate of the fifteenth thin film transistor T14 is connected with the gate of the twelfth thin film transistor T11.

Return to FIG. 11, the buffer module 40 includes a buffer input terminal 41 and a buffer output terminal 42, wherein the buffer output terminal input end 41 is connected with the process output terminal 33, and the buffer output terminal 42 is used for inputting the scan signal G(n).

The buffer module 40 further includes:

A fourth inverter group 43 including an eleventh inverter 44, a twelfth inverter 45 and a thirteenth inverter 46, which are connected in sequence, wherein an input terminal of the fourth inverter group 43 is connected with the buffer input terminal 41, and an output terminal of the fourth inverter is connected with the buffer output terminal 42.

The GOA driving circuit of the present invention generates the forward scan control signal based upon the first clock signal and the cascade signal, can also generates the reverse scan control signal based upon the second clock signal and the cascade signal, and further generates the function control signal based upon the second clock signal, the first clock signal, and the reset signal. Since some of the signal sources of the GOA driving circuit are used to generate the other signal sources, the GOA driving circuit of the present invention reduces the number of output terminals of the driver chip, simplifies the driver chip, and decreases the high production cost of the driver chips.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A Gate driver On Array (GOA) driving circuit, comprising:
at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:
a first signal generating module for generating the forward scan control signal based upon the first clock signal and the cascade signal;
a second signal generating module for generating the reverse scan control signal based upon the second clock signal and the cascade signal;
a control module for controlling an output of the cascade signal based upon the forward scan control signal and the reverse scan control signal;
a latch module for latching the cascade signal and generating a latch signal by the first clock signal and the second clock signal;
a third signal generating module for generating the function control signal based upon the second clock signal, the first clock signal and the reset signal;
a processing module for conducting an NAND logic process on the latch signal to obtain a processing signal by the second clock signal or the first clock signal, and controlling an output of the processing signal based upon the function control signal; and
a buffer module for reversing an output signal from the processing module to obtain a scan signal for increasing a driving capability of the scan signal; wherein the first signal generating module includes a first clock signal input terminal, a first switch signal input terminal, a second switch signal input terminal, and a first converting output terminal, wherein the first converting output terminal is used for outputting the forward scan control signal, the first clock input terminal is used for inputting the first clock signal, and the first switch signal input terminal and the second switch signal input terminal are both used for inputting the cascade signal; and the first signal generating module further includes:
a first thin film transistor including a first gate, a first source, and a first drain; wherein the first gate is connected with the first switch signal input terminal, the first source is connected with the first clock signal input terminal, and the first drain connected with an input terminal of a first latch;
a first inverter, an input terminal of which is connected with the second switch signal input terminal;
a second thin film transistor including a second gate, a second source and a second drain, wherein the second gate is connected with an output terminal of the first inverter, the second source is connected with the first clock signal input terminal, and the second drain connected with the input terminal of the first latch;
the first latch, the output terminal of which is connected with an input terminal of a first inverter group; and
the first inverter group including a second inverter, a third inverter and a fourth inverter, which are connected in sequence, wherein an output terminal of the first inverter group is connected with the first converting output terminal;
wherein the second signal generating module includes a second clock signal input terminal, a third switch signal input terminal, a fourth switch signal input terminal, and a second converting output terminal, wherein the second converting output terminal is used for outputting the reverse scan control signal, the second clock input terminal is used for inputting the second clock signal, and the third switch signal input terminal and the fourth switch signal input terminal are both used for inputting the cascade signal; and the second signal generating module further includes:
a seventh thin film transistor including a seventh gate, a seventh source, and a seventh drain, wherein the seventh gate is connected with the third switch signal input terminal, the seventh source is connected with the second clock signal input terminal, and the seventh drain is connected with an input terminal of a second latch;
a fifth inverter, an input terminal of which is connected with the fourth switch signal input terminal;
- an eighth thin film transistor including an eighth gate, an eighth source, and an eighth drain, wherein the eighth gate is connected with an output terminal of the fifth inverter, the eighth source is connected with the second clock signal input terminal, and the eighth drain is connected with the input terminal of the second latch;
- the second latch, the input terminal of which is connected with an input terminal of a second inverter group; and
- the second inverter group including a fifth inverter, a sixth inverter and a seventh inverter, which are connected in sequence, wherein an output terminal of the second inverter group is connected with the second converting output terminal.

2. The GOA driving circuit as claimed in claim 1, wherein the control module includes a first cascade signal input terminal, a second cascade signal input terminal, a first switch control signal input terminal, a second switch control signal input terminal, and a first cascade signal output terminal, wherein the first switch control signal input terminal is used for inputting the forward scan control signal, the second switch control signal input terminal is used for inputting the reverse scan control signal, the first cascade signal input terminal is used for inputting a first cascade signal, the second cascade signal input terminal is used for inputting a second cascade signal, the first cascade signal output terminal is used for outputting the first cascade signal or the second cascade signal, the first switch control signal input terminal is connected with the first converting output terminal, and the second switch control signal input terminal is connected with the second converting output terminal; and
the control module includes:
- a third thin film transistor including a third gate, a third source, and a third drain, wherein the third gate is connected with the first switch control signal input terminal, the third source is connected with the first cascade signal input terminal, the third drain is connected with the first cascade signal output terminal, and the third thin film transistor is used for controlling an output of the first cascade signal based upon the forward scan control signal;
- a fourth thin film transistor including a fourth gate, a fourth source, and a fourth drain, wherein the fourth gate is connected with the first switch control signal input terminal, the fourth source is connected with the second cascade signal input terminal, the fourth drain is connected with the first cascade signal output terminal, and the fourth thin film transistor is used for controlling an output of the second cascade signal based upon the forward scan control signal;
- a fifth thin film transistor including a fifth gate, a fifth source, and a fifth drain, wherein the fifth gate is connected with the second switch control signal input terminal, the fifth source is connected with the first cascade signal input terminal, the fifth drain is connected with the first cascade signal output terminal, the fourth thin film transistor is used for controlling an output of the first cascade signal based upon the reverse scan control signal; and
- a sixth thin film transistor including a sixth gate, a sixth source, and a sixth drain, wherein the sixth gate is connected with the second switch control signal input terminal, the sixth source is connected with the second cascade signal input terminal, the sixth drain is connected with the first cascade signal output terminal, and the sixth thin film transistor is used for controlling an output of the second cascade signal based upon the reverse scan control signal.

3. The GOA driving circuit as claimed in claim 1, wherein the N-th stage driving unit is also inputted with a high voltage power source;
the third signal generating module includes a third clock signal input terminal, a fourth clock signal input terminal, a first signal source input terminal, a fifth switch signal input terminal, and a third converting output terminal, wherein the third clock signal input terminal is used for inputting the first clock signal, the fourth clock signal input terminal is used for inputting the second clock signal, the first signal source input terminal is used for inputting the high voltage power source, the fifth switch signal input terminal is used for inputting the reset signal, and the third switch output terminal is used for outputting the function control signal; and
the third signal generating module further includes:
- a first NAND gate including a first logic input terminal, a second logic input terminal, and a first logic output terminal, wherein the first logic input terminal is connected with the third clock signal input terminal, the second logic input terminal is connected with the fourth clock signal input terminal, the first logic output terminal is connected with a ninth drain;
- a ninth thin film transistor including a ninth gate, a ninth source, and the ninth drain, wherein the ninth gate is connected with the fifth switch signal input terminal, the ninth source is connected with the first signal source input terminal, and the ninth drain is connected with an input terminal of a third inverter group; and
- the third inverter group including an eighth inverter, a ninth inverter, and a tenth inverter, which are connected in sequence, wherein an output terminal of the third inverter group is connected with the third switch output terminal.

4. The GOA driving circuit as claimed in claim 3, wherein the N-th stage driving unit is also inputted with a low voltage power source;
the processing module includes a sixth clock signal input terminal, a fourth cascade signal input terminal, a process output terminal, a second signal source input terminal, and a sixth switch signal input terminal, wherein the second signal source input terminal is used for inputting a low voltage power source, the sixth switch signal input terminal is used for inputting the function control signal, and the sixth switch signal input terminal is connected with the third switch output terminal; and
a second NAND gate includes a third logic input terminal, a fourth logic input terminal, a second logic output terminal, wherein the third logic input terminal is connected with the sixth clock signal input terminal, the fourth logic input terminal is connected with the fourth cascade signal input terminal, and the second logic output terminal is connected with the process output terminal;

the tenth thin film transistor includes a tenth gate, a tenth source, and a tenth drain, wherein the tenth gate is connected with the sixth switch signal input terminal, the tenth source is connected with the second signal source input terminal, and the tenth drain is connected with the second logic output terminal.

5. The GOA driving circuit as claimed in claim 4, wherein the buffer module includes a buffer input terminal and a buffer output terminal, wherein the buffer output terminal input end is connected with the process output terminal, and the buffer output terminal is used for inputting the scan signal; and the buffer module further includes:
  a fourth inverter group including an eleventh inverter, a twelfth inverter, and a thirteenth inverter, which are connected in sequence, wherein an input terminal of the fourth inverter group is connected with the buffer input terminal, and an output terminal of the fourth inverter is connected with the buffer output terminal.

6. The GOA driving circuit as claimed in claim 1, wherein the latch module includes a fifth clock signal input terminal, a third cascade signal input terminal, a latch signal output terminal, a reset signal input terminal, and a high voltage power source input terminal, wherein the fifth clock signal input terminal is used for inputting the first clock signal or the second clock signal, the third cascade signal input terminal is used for inputting the first cascade signal or the second cascade signal, the reset signal input terminal is used for inputting the reset signal, the high voltage power source input terminal is used for inputting the high voltage power source, and the latch signal output terminal is used for outputting the latch signal; and the latch module further includes:
  a fourteenth inverter including a fourteenth inverting input terminal, a fourteenth inverting output terminal, wherein the fourteenth inverting input terminal is connected with the fifth clock signal input terminal, to receive the first clock signal or the second clock signal;
  a fifteenth inverter including a fifteenth inverting input terminal and a fifteen inverting output terminal, wherein the fifteenth inverting input terminal is connected with the third cascade signal input terminal, and the fifteenth inverter is also connected with the fourteenth inverting output terminal and the fifth clock signal input terminal;
  a sixteenth inverter including a sixteenth inverting input terminal and a sixteenth inverting output terminal, wherein the sixteenth inverting input terminal is connected to the latch signal output terminal, the sixteenth inverting output terminal is connected with the fifteenth inverting output terminal, and the sixteenth inverter is also connected with the fourteenth inverting output terminal and the fifth clock signal input terminal;
  an eleventh thin film transistor including an eleventh gate, an eleventh source, and an eleventh drain, wherein the eleventh gate is connected with the reset signal input terminal, the eleventh source is connected with the high voltage power source input terminal, and the eleventh drain is connected with the sixteenth inverting output terminal; and
  a seventeenth inverter including a seventeenth inverting input terminal and a seventeenth inverting output terminal, wherein the seventeenth inverting input terminal is connected with the eleventh drain, the seventeenth inverting output terminal and the latch signal output terminal.

7. A Gate driver On Array (GOA) driving circuit, comprising:
at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:
  a control module for controlling an output of the cascade signal based upon the forward scan control signal and the reverse scan control signal;
  a latch module for latching the cascade signal and generating a latch signal by the first clock signal and the second clock signal;
  a third signal generating module for generating the function control signal based upon the second clock signal, the first clock signal and the reset signal;
  a processing module for conducting an NAND logic process on the latch signal to obtain a processing signal by the second clock signal or the first clock signal, and controlling an output of the processing signal based upon the function control signal; and
  a buffer module for reversing an output signal from the processing module to obtain a scan signal for increasing a driving capability of the scan signal;

wherein the N-th stage driving unit is also inputted with a high voltage power source;

the third signal generating module includes a third clock signal input terminal, a fourth clock signal input terminal, a first signal source input terminal, a fifth switch signal input terminal, and a third converting output terminal, wherein the third clock signal input terminal is used for inputting the first clock signal, the fourth clock signal input terminal is used for inputting the second clock signal, the first signal source input terminal is used for inputting the high voltage power source, the fifth switch signal input terminal is used for inputting the reset signal, and the third switch output terminal is used for outputting the function control signal; and the third signal generating module further includes:
  a first NAND gate including a first logic input terminal, a second logic input terminal and a first logic output terminal, wherein the first logic input terminal is connected with the third clock signal input terminal, the second logic input terminal is connected with the fourth clock signal input terminal, the first logic output terminal is connected with a ninth drain;
  a ninth thin film transistor including a ninth gate, a ninth source, and the ninth drain, wherein the ninth gate is connected with the fifth switch signal input terminal, the ninth source is connected with the first signal source input terminal, and the ninth drain is connected with an input terminal of a third inverter group; and
  the third inverter group including an eighth inverter, a ninth inverter, and a tenth inverter, which are connected in sequence, wherein an output terminal of the third inverter group is connected with the third switch output terminal;

wherein the N-th stage driving unit is also inputted with a low voltage power source;

the processing module includes a sixth clock signal input terminal, a fourth cascade signal input terminal, a process output terminal, a second signal source input terminal, a sixth switch signal input terminal, wherein the second signal source input terminal is used for inputting a low voltage power source, the sixth switch signal input terminal is used for inputting the function control signal, and the sixth switch signal input terminal is connected with the third converting output terminal;

a second NAND gate includes a third logic input terminal, a fourth logic input terminal, a second logic output terminal, wherein the third logic input terminal is connected with the sixth clock signal input terminal, the fourth logic input terminal is connected with the fourth cascade signal input terminal, and the second logic output terminal is connected with the process output terminal;

the tenth thin film transistor includes a tenth gate, a tenth source and a tenth drain, wherein the tenth gate is connected with the sixth switch signal input terminal, the tenth source is connected with the second signal source input terminal, and the tenth drain is connected with the second logic output terminal.

8. The GOA driving circuit as claimed in claim 7, wherein the latch module includes a fifth clock signal input terminal, a third cascade signal input terminal, a latch signal output terminal, a reset signal input terminal, a high voltage power source input terminal, wherein the fifth clock signal input terminal is used for inputting the first clock signal or the second clock signal, the third cascade signal input terminal is used for inputting the first cascade signal or the second cascade signal, the reset signal input terminal is used for inputting the reset signal, the high voltage power source input terminal is used for inputting the high voltage power source, and the latch signal output terminal is used for outputting the latch signal; and the latch module further includes:
  a fourteenth inverter including a fourteenth inverting input terminal, a fourteenth inverting output terminal, wherein the fourteenth inverting input terminal is connected with the fifth clock signal input terminal, to receive the first clock signal or the second clock signal;
  a fifteenth inverter including a fifteenth inverting input terminal and a fifteen inverting output terminal, wherein the fifteenth inverting input terminal is connected with the third cascade signal input terminal, and the fifteenth inverter is also connected with the fourteenth inverting output terminal and the fifth clock signal input terminal;
  a sixteenth inverter including a sixteenth inverting input terminal and a sixteenth inverting output terminal, wherein the sixteenth inverting input terminal is connected to the latch signal output terminal, the sixteenth inverting output terminal is connected with the fifteenth inverting output terminal, and the sixteenth inverter is also connected with the fourteenth inverting output terminal and the fifth clock signal input terminal;
  an eleventh thin film transistor includes an eleventh gate, an eleventh source and an eleventh drain, wherein the eleventh gate is connected with the reset signal input terminal, the eleventh source is connected with the high voltage power source input terminal, and the eleventh drain is connected with the sixteenth inverting output terminal;
  a seventeenth inverter including a seventeenth inverting input terminal and a seventeenth inverting output terminal, wherein the seventeenth inverting input terminal is connected with the eleventh drain, the seventeenth inverting output terminal and the latch signal output terminal.

9. The GOA driving circuit as claimed in claim 8, wherein the buffer module includes a buffer input terminal and a buffer output terminal, wherein the buffer output terminal input end is connected with the process output terminal, and the buffer output terminal is used for inputting the scan signal; and the buffer module further includes:
  a fourth inverter group including an eleventh inverter, a twelfth inverter, and a thirteenth inverter, which are connected in sequence, wherein an input terminal of the fourth inverter group is connected with the buffer input terminal, and an output terminal of the fourth inverter is connected with the buffer output terminal.

10. A Gate driver On Array (GOA) driving circuit, comprising:
at least two driving units cascaded to each other, wherein an N-th stage driving unit is inputted with a cascade signal, a forward scan control signal, a reverse scan control signal, a first clock signal, a second clock signal, a reset signal, and a function control signal; and the N-th stage driving unit includes:
  a first signal generating module for generating the forward scan control signal based upon the first clock signal and the cascade signal;
  a second signal generating module for generating the reverse scan control signal based upon the second clock signal and the cascade signal;
  a control module for controlling an output of the cascade signal based upon the forward scan control signal and the reverse scan control signal;
  a latch module for latching the cascade signal and generating a latch signal by the first clock signal and the second clock signal;
  a third signal generating module for generating the function control signal based upon the second clock signal, the first clock signal and the reset signal;
  a processing module for conducting an NAND logic process on the latch signal to obtain a processing signal by the second clock signal or the first clock signal, and controlling an output of the processing signal based upon the function control signal; and
  a buffer module for reversing an output signal from the processing module to obtain a scan signal for increasing a driving capability of the scan signal;

wherein the N-th stage driving unit is also inputted with a high voltage power source;

the third signal generating module includes a third clock signal input terminal, a fourth clock signal input terminal, a first signal source input terminal, a fifth switch signal input terminal, and a third converting output terminal, wherein the third clock signal input terminal is used for inputting the first clock signal, the fourth clock signal input terminal is used for inputting the second clock signal, the first signal source input terminal is used for inputting the high voltage power source, the fifth switch signal input terminal is used for inputting the reset signal, and the third switch output terminal is used for outputting the function control signal; and the third signal generating module further includes:
  a first NAND gate including a first logic input terminal, a second logic input terminal, and a first logic output terminal, wherein the first logic input terminal is connected with the third clock signal input terminal, the second logic input terminal is connected with the fourth clock signal input terminal, the first logic output terminal is connected with a ninth drain;
  a ninth thin film transistor including a ninth gate, a ninth source, and the ninth drain, wherein the ninth gate is connected with the fifth switch signal input terminal, the ninth source is connected with the first signal source input terminal, and the ninth drain is connected with an input terminal of a third inverter group; and
  the third inverter group including an eighth inverter, a ninth inverter, and a tenth inverter, which are connected in sequence, wherein an output terminal of the third inverter group is connected with the third switch output terminal;
wherein the N-th stage driving unit is also inputted with a low voltage power source;
the processing module includes a sixth clock signal input terminal, a fourth cascade signal input terminal, a process output terminal, a second signal source input terminal, and a sixth switch signal input terminal, wherein the second signal source input terminal is used for inputting a low voltage power source, the sixth switch signal input terminal is used for inputting the function control signal, and the sixth switch signal input terminal is connected with the third switch output terminal; and
  a second NAND gate includes a third logic input terminal, a fourth logic input terminal, a second logic output terminal, wherein the third logic input terminal is connected with the sixth clock signal input terminal, the fourth logic input terminal is connected with the fourth cascade signal input terminal, and the second logic output terminal is connected with the process output terminal;
  the tenth thin film transistor includes a tenth gate, a tenth source, and a tenth drain, wherein the tenth gate is connected with the sixth switch signal input terminal, the tenth source is connected with the second signal source input terminal, and the tenth drain is connected with the second logic output terminal.

11. The GOA driving circuit as claimed in claim 10, wherein
the buffer module includes a buffer input terminal and a buffer output terminal, wherein the buffer output terminal input end is connected with the process output terminal, and the buffer output terminal is used for inputting the scan signal; and
the buffer module further includes:

a fourth inverter group including an eleventh inverter, a twelfth inverter, and a thirteenth inverter, which are connected in sequence, wherein an input terminal of the fourth inverter group is connected with the buffer input terminal, and an output terminal of the fourth inverter is connected with the buffer output terminal.

12. The GOA driving circuit as claimed in claim 10, wherein
the latch module includes a fifth clock signal input terminal, a third cascade signal input terminal, a latch signal output terminal, a reset signal input terminal, and a high voltage power source input terminal, wherein the fifth clock signal input terminal is used for inputting the first clock signal or the second clock signal, the third cascade signal input terminal is used for inputting the first cascade signal or the second cascade signal, the reset signal input terminal is used for inputting the reset signal, the high voltage power source input terminal is used for inputting the high voltage power source, and the latch signal output terminal is used for outputting the latch signal; and the latch module further includes:
  a fourteenth inverter including a fourteenth inverting input terminal, a fourteenth inverting output terminal, wherein the fourteenth inverting input terminal is connected with the fifth clock signal input terminal, to receive the first clock signal or the second clock signal;
  a fifteenth inverter including a fifteenth inverting input terminal and a fifteen inverting output terminal, wherein the fifteenth inverting input terminal is connected with the third cascade signal input terminal, and the fifteenth inverter is also connected with the fourteenth inverting output terminal and the fifth clock signal input terminal;
  a sixteenth inverter including a sixteenth inverting input terminal and a sixteenth inverting output terminal, wherein the sixteenth inverting input terminal is connected to the latch signal output terminal, the sixteenth inverting output terminal is connected with the fifteenth inverting output terminal, and the sixteenth inverter is also connected with the fourteenth inverting output terminal and the fifth clock signal input terminal;
  an eleventh thin film transistor including an eleventh gate, an eleventh source, and an eleventh drain, wherein the eleventh gate is connected with the reset signal input terminal, the eleventh source is connected with the high voltage power source input terminal, and the eleventh drain is connected with the sixteenth inverting output terminal; and
  a seventeenth inverter including a seventeenth inverting input terminal and a seventeenth inverting output terminal, wherein the seventeenth inverting input terminal is connected with the eleventh drain, the seventeenth inverting output terminal and the latch signal output terminal.

* * * * *